(12) United States Patent
Lynass et al.

(10) Patent No.: US 8,796,604 B2
(45) Date of Patent: Aug. 5, 2014

(54) APPARATUS HAVING A CONTROLLABLE FILTER MATRIX TO SELECTIVELY ACQUIRE DIFFERENT COMPONENTS OF SOLAR IRRADIANCE

(75) Inventors: Mark Ronald Lynass, Bavaria (DE); Christian Heller, Bavaria (DE); Michael Schmidt, Bayern (DE)

(73) Assignee: General Electric Company, Niskayuna, NY (US)

( * ) Notice: Subject to any disclaimer, the term of this patent is extended or adjusted under 35 U.S.C. 154(b) by 352 days.

(21) Appl. No.: 13/300,811

(22) Filed: Nov. 21, 2011

(65) Prior Publication Data

US 2013/0126706 A1 May 23, 2013

(51) Int. Cl.
*H01L 31/00* (2006.01)
(52) U.S. Cl.
USPC ............... 250/203.4; 250/206.1; 136/257; 126/701
(58) Field of Classification Search
USPC .......... 250/203.1, 203.3, 203.4, 206.1, 206.2, 250/216, 226; 348/342, 360, 361; 136/246, 136/257; 126/573, 701
See application file for complete search history.

(56) References Cited

U.S. PATENT DOCUMENTS

| | | | |
|---|---|---|---|
| 4,082,947 A | 4/1978 | Haywood et al. | |
| 5,264,691 A | 11/1993 | Hegyi | |
| 6,849,842 B2 | 2/2005 | Little | |
| 6,864,473 B2 | 3/2005 | Chretien et al. | |
| 7,796,833 B2 * | 9/2010 | Polonskiy et al. | 382/274 |
| 7,847,182 B2 | 12/2010 | Lin et al. | |
| 7,893,391 B2 | 2/2011 | Horne et al. | |
| 7,973,838 B2 | 7/2011 | McCutchen | |
| 2007/0084502 A1 | 4/2007 | Kelly et al. | |
| 2008/0007645 A1 * | 1/2008 | McCutchen | 348/360 |

OTHER PUBLICATIONS

Amauri P. De Oliveira, Antonio J. Machado and João F. Escobedo, A New Shadow-Ring Device for Measuring Diffuse Solar Radiation at the Surface, Journal of Atmospheric and Oceanic Technology, vol. 19, pp. 698-708, 2002 American Meteorological Society, Sao Paulo, Brazil.
Uwe Feister, Janet Shields, Monette Karr, Richard Johnson, Klaus Dehne and Michael Woldt, Ground-Based Cloud Images and Sky Radiances in the Visible and Near Infrared Region From Whole Sky Imager Measurements, 2000, 10 pages, Deutscher Wetterdienst, Meteorologisches Observatorium Potsdam, Germany.
Multi-Filter Rotating Shadow Band Radiometer Model MFR-7, Yankee Environmental Systems, Inc., 2004, 6 pages, Turner Falls, MA.
Deutsche Gesellschaft Fur Sonnenenergie, Photovoltaic Basics, Planning and Installing Photovoltaic Systems: A Guide for Installers, Architects and Engineers, Dec. 18, 2007, pp. 1-64.

* cited by examiner

*Primary Examiner* — Kevin Pyo
(74) *Attorney, Agent, or Firm* — Paul J. DiConza

(57) ABSTRACT

Apparatus and method, as may be used to acquire different components of solar irradiance in a solar-based power generation system or as may be used in a sky imager, are provided. A filter matrix (12) may be arranged to receive incident solar irradiance. The filter matrix may include an array of pixels (20) controllable to selectively acquire different components of the solar irradiance. A module, such as a photosensor (22) or calculator module (29) may be configured to determine a spatial location of at least one of the irradiance components relative to the array of pixels of the filter matrix. A controller (26) may be electrically coupled to the module to supply a control signal to the filter matrix based on the determined location of the irradiance component to pass a selected one of the irradiance components.

22 Claims, 2 Drawing Sheets

APPARATUS HAVING A CONTROLLABLE FILTER MATRIX TO SELECTIVELY ACQUIRE DIFFERENT COMPONENTS OF SOLAR IRRADIANCE

FIELD OF THE INVENTION

The present invention is generally related to apparatus to measure solar irradiance, as may be used in solar-based power generation systems, and, more particularly, to apparatus to selectively acquire different components of solar irradiance.

BACKGROUND OF THE INVENTION

Large-scale generation of electric power based on solar irradiance continues progressing as an attractive modality for clean and efficient generation of electric power. Solar irradiance may reach a horizontal surface on the earth along two main paths, such as directly from the sun and by way of diffuse irradiance, which does not arrive on a direct path from the sun (e.g., has no defined direction) since it is made up of irradiance scattered by molecules and/or particles in the atmosphere. Depending upon cloud conditions and/or time of day (e.g., solar altitude), both the total amount of irradiance (e.g., global irradiance) and the respective proportions of direct and diffuse irradiance, which make up the global irradiance, may vary greatly.

Often a measurement of at least one or both of those solar irradiance components may be needed to, for example, estimate the power conversion efficiency of a solar-based power generation system at a given location. For example, measurements of direct irradiance may be of particular interest in concentrating solar thermal systems and/or in systems that track the position of the sun. By way of comparison, measurements of diffuse irradiance may be of more relevance in photovoltaic-based (PV-based) systems.

In the case of measurements of diffuse irradiance, it is known to use some kind of mechanically-rotatable shadowing device, where a shadowing mechanical structure, such as ball, ring or band, generally involves a costly and complicated mechanical contraption to meet a required mechanical tracking accuracy, which may be difficult to consistently realize over a long period of time in the outdoors. A further undesirable characteristic of such devices may be measurement errors introduced by the shadowing mechanical structure, which may physically block at least some of the field of view needed to accurately capture the diffuse irradiance component. In the case of measurements of direct irradiance, high-intensity irradiance may cause sensor burn-in effects which may shorten reliable operation of a sensor over time.

In view of the foregoing considerations, it would be desirable to provide an improved apparatus, such as may be able to reliably and at a relatively lower cost be able to accurately measure selected different components of solar irradiance.

BRIEF DESCRIPTION

Aspects of the present invention may be fulfilled by an apparatus including a filter matrix arranged to receive incident solar irradiance. The filter matrix may comprise an array of pixels controllable to selectively pass different components of the solar irradiance. A module may be configured to determine a spatial location of at least one of the irradiance components relative to the array of pixels of the filter matrix. A controller may be coupled to the module to supply a control signal to the filter matrix based on the determined location of the irradiance component to pass a selected one of the irradiance components.

Further aspects of the present invention may be fulfilled by an apparatus, which may include a filter matrix arranged to receive incident solar irradiance. The filter matrix may comprise an array of pixels controllable to provide a selectable field of view to selected different components of the solar irradiance. A photosensor may be coupled to receive any selected one of the irradiance components passed by the filter matrix. A processor may be coupled to the photosensor to determine an irradiance measurement from any irradiance component received by the photosensor.

Yet further aspects of the present invention may be fulfilled by a sky imager as may include a filter matrix arranged to receive light in a field of view of the sky imager. The filter matrix may comprise an array of pixels controllable to selectively attenuate at least a direct solar irradiance component in the field of view of the sky imager. An imaging photosensor may be optically coupled to receive light passed by the filter matrix and supply imaging data corresponding to the field of view of the sky imager. The imaging photosensor may be further configured to sense a spatial location of the direct irradiance component relative to the array of pixels of the filter matrix. A controller may be coupled to the imaging photosensor and may be configured to supply a control signal to the filter matrix based on the determined location of the direct irradiance component to attenuate the direct irradiance component. An imaging processor may be coupled to receive the imaging data from the imaging photosensor to generate an image substantially free from image defects, which would otherwise arise if the direct solar irradiance component in the field of view of the sky imager was not attenuated by the array of pixels of the filter matrix.

Still further aspects of the present invention may be fulfilled by a method for selectively acquiring different components of solar irradiance with a single apparatus. The method may include arranging a filter matrix to receive incident solar irradiance. The filter matrix may comprise an array of pixels electrically controllable to selectively acquire different components of the solar irradiance. The method may further include determining a spatial location of at least one of the irradiance components relative to the array of pixels of the filter matrix. The filter matrix may be controlled based on the determined location of the irradiance component to pass a selected one of the irradiance components.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
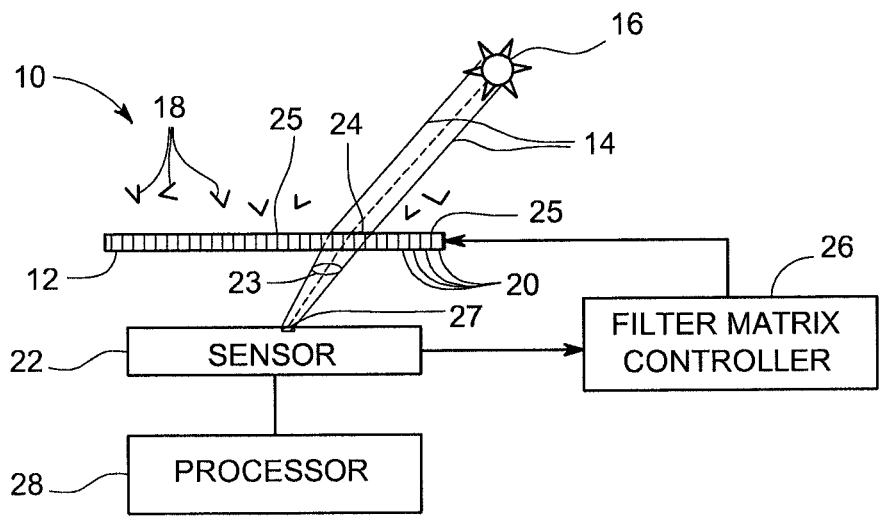
FIG. 1 is a schematic representation of an example embodiment of an apparatus embodying aspects of the present invention, as may be controlled to be in a first example operating condition, such as to acquire a direct irradiance component.

FIG. 1 shows a schematic representation of an example embodiment of an apparatus 10 embodying aspects of the present invention. A filter matrix 12 may be arranged to receive incident solar irradiance, such as a direct irradiance component (symbolically represented by light beams 14 from the sun 16) and a diffuse irradiance component (symbolically represented by a plurality of multidirectional arrow heads 18). Filter matrix 12 may comprise an array of pixels 20 controllable (e.g., electrically controllable) to selectively acquire different components of such solar irradiance component. For example, the array of pixels 20 may be controllable to provide a selectable field of view to selected different components of the solar irradiance.

Example embodiments of filter matrix 12 may include any of a variety of pixelated arrays, such as arrays where the opacity (light-passing ability) of each pixel may be selectively controlled in response to an appropriate control signal (e.g., electrical control) so that any given pixel may be set in an opaque state or may be set in a transparent state. In some example embodiments, a level of the control signal (e.g., a voltage level) may be adjustable so that the opacity of a given pixel may be adjustable. Example pixel arrays for filter matrix 12 may be an array of liquid crystal pixels, an array of electrochromic pixels and an array of micro-mirror pixels, which is a micro-electromechanical system (MEMS) device. One example of such a device is known in the art as a digital micromirror device (DMD).

Figure 3:
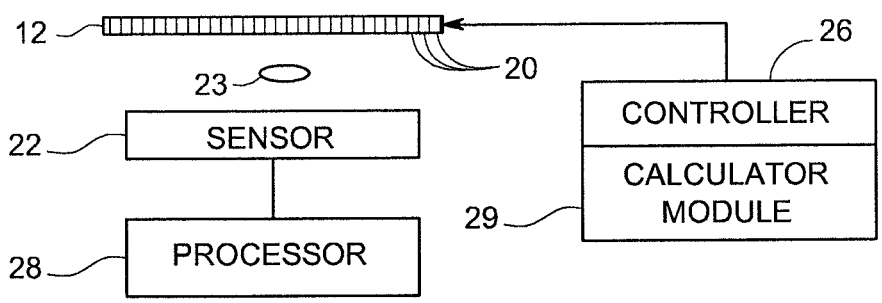
FIG. 3 is a schematic representation of another example embodiment of an apparatus embodying aspects of the present invention.

A sensing module, such as a photosensor 22, may be configured to determine a spatial location of one or more of the irradiance components (e.g., the position of the solar disk) relative to the array of pixels of filter matrix 12. Photosensor 22 may be an imager photosensor, such as may include a charge coupled device (CCD) array, a complementary metal-oxide-semiconductor (CMOS) array, a hybrid CCD/CMOS array or any other semiconductor-based imaging sensor array. A lens or lens optics 23 may be arranged to appropriately direct (e.g., focus) light onto photosensor 22. It is contemplated that in certain applications in lieu of a sensing module one may optionally use a calculator module 29 (FIG. 3) configured to calculate for any given geographical location and time a corresponding solar position, as may be indicative of the spatial location of the direct irradiance component relative to the array of pixels 20 of filter matrix 12.

A filter matrix controller 26 may be coupled (e.g., electrically coupled) to photosensor 22 (or calculator module 29 (FIG. 3)) to supply a control signal to filter matrix 12 based on the determined location of the irradiance component to pass a selected one of the irradiance components, which may or may not be attenuated. FIG. 1 illustrates an example, where the control signal from filter matrix controller 26 is configured to pass just the direct irradiance component to photosensor 22 while blocking the diffuse irradiance component. For example, pixels in a region highlighted by a bold line 24 represent pixels of filter matrix 12 set to pass the direct irradiance component while pixels in respective regions represented by lighter lines 25 represent pixels of filter matrix 12 set to block the direct irradiance component. It will be appreciated that the level of transparency (e.g., level of attenuation) imparted by the pixels of filter matrix 12, which are set to pass the direct irradiance component may be appropriately adjusted to avoid exposing photosensor 22 to relatively high-levels of the direct irradiance component and thus avoid the possibility of sensor burn-in. It will be appreciated that signal attenuation introduced by the filter matrix may be suitably calibrated to appropriately account for such attenuation when determining irradiance measurements. Cross-hatching 27 is shown in FIG. 1 to highlight an example region of sensor 22 illuminated by the direct irradiance component.

Figure 2:
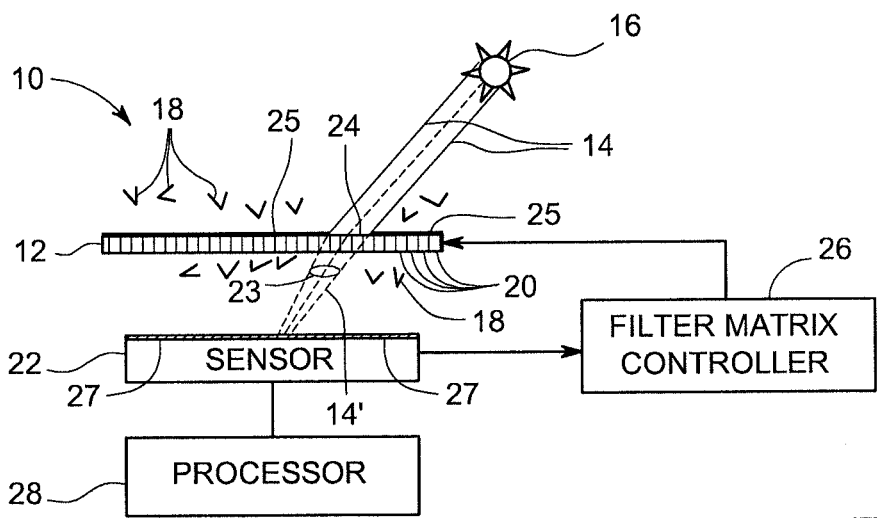
FIG. 2 shows the apparatus of FIG. 1, as may be controlled to be in a second example operating condition, such as to acquire a diffuse irradiance component.

FIG. 2 illustrates an example, where the control signal from filter matrix controller 26 is configured to acquire just the diffuse irradiance component to photosensor 22 while blocking passage of the direct irradiance component (symbolically representing its absence by the light beams 14' drawn in dashed lines in FIG. 2). In this example, pixels in the example region represented by lighter line 24 represent pixels of filter matrix 12 set to block the direct irradiance component while pixels in respective example regions highlighted by bold lines 25 represent pixels of filter matrix 12 set to pass the direct irradiance component. Cross-hatching 27 is shown in FIG. 2 to highlight example regions of sensor 22 illuminated by the diffuse irradiance component.

In one example embodiment, a processor 28 may be coupled to photosensor 22 to determine an irradiance measurement from one or more irradiance components received by photosensor 22. For example, in the example case described in connection with FIG. 1, processor 28 may determine a measurement of direct irradiance and in the example case described in connection with FIG. 2, processor 28 may determine a measurement of diffuse irradiance. It would be appreciated that a measurement of global irradiance may be derived by processor 28 once the measurements of direct and diffuse irradiance have been determined.

In one example embodiment, respective measurements of diffuse irradiance and direct irradiance may be performed by alternately and sequentially controlling filter matrix 12 to sequentially acquire a number of irradiance readings, which may then be averaged. For example, during a first time interval, a first group of the array of pixels of filter matrix 12 may be actuated to pass the direct irradiance component and a second group of the array of pixels of the filter matrix 12 may be actuated to block during the first time interval the diffuse irradiance component. Then, during a second time interval, the second group of the array of pixels of the filter matrix may be actuated to pass the diffuse irradiance component and the first group of the array may be actuated to block the direct irradiance component during the second time interval. In this example embodiment, a respective measurement of direct irradiance may be based on an average of the direct irradiance passed by the filter matrix during a sequence of first time intervals and a respective measurement of diffuse irradiance may be based on an average of the diffuse irradiance passed by the filter matrix during a sequence of second time intervals.

Figure 4:
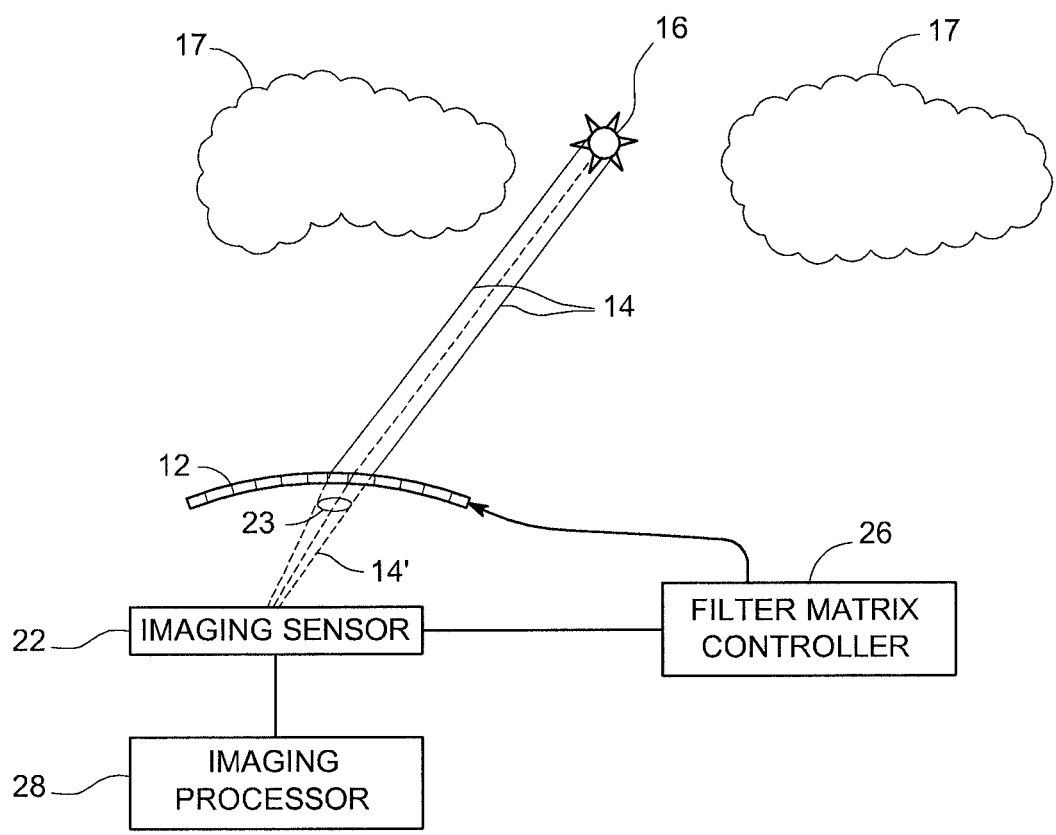
FIG. 4 is a schematic representation of another example embodiment of an apparatus embodying aspects of the present invention as may be applied in the context of a sky imager.

It is contemplated that aspects of the present invention may be applied in the context of a sky imager, such as may be used for detection and/or prediction of cloud coverage and the like. For example, as illustrated in FIG. 4, one may want to acquire images of the sky to, for example, monitor cloud formation, such as may be illustratively represented by clouds 17, but a high-intensity light source, such as the sun 16, may occupy at least some of the field of view of the sky imager. For example, at least some of a direct solar irradiance component (e.g., solar disk) may be in the field of view of the sky imager. During illumination situations, as described above, imaging sensor 22 (i.e., the imaging array of the sky imager, e.g., a CCD array) may be subject to challenging high-dynamic range conditions, where at least some areas of the imaging array of the sky imager may be over illuminated and potentially could give rise to saturation conditions due to excess electrical charges (also potentially subject to pixel burn-in) while other areas of the imaging array may be under-exposed, potentially leading to losses of imaging data. Under such illumination conditions, it is contemplated that an apparatus involving a filter matrix 12, as described above, may be effectively used to spatially modulate or otherwise selectively limit the amount of light falling on one or more regions of the imaging sensor array and thereby avoid the foregoing issues. For example, one may partially or completely block the direct irradiance component, (e.g., solar disk) which may be present in the field of view of the sky imager.

In one example embodiment, the field of view of the sky imager may encompass an angular coverage of approximately at least 90 degrees, and filter matrix 12 may be configured to have a spheroidal shape, as exemplarily illustrated in FIG. 4. In this example embodiment, processor 28 may be configured to process imaging data from imaging sensor to generate images (e.g., photographs), which provide improved imaging of cloud formations, for example, notwithstanding the presence of one or more high-intensity light sources in the field of view of the sky imager.

It will be appreciated that aspects of the present invention are not limited to sensors, which operate in the visible spectrum of light since aspects of the present invention may be effectively utilized in sensors, which operate at wavelengths outside the visible spectrum of light, such as infrared sensors, etc.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An apparatus comprising:
a filter matrix arranged to receive incident solar irradiance, the filter matrix comprising an array of pixels electrically controllable to selectively acquire different irradiance components;
a module configured to determine a spatial location of at least one of the irradiance components relative to the array of pixels of the filter matrix; and
a controller electrically coupled to the module and configured to:
supply a control signal to the filter matrix based on the determined spatial location of the irradiance components to pass a selected one of the irradiance components, wherein the selected one of the irradiance components comprises a direct irradiance component or a diffuse irradiance component;
sequentially perform the following:
1) during a first time interval actuating a first group of the array of pixels of the filter matrix to pass the direct irradiance component and actuating a second group of the array of pixels of the filter matrix to block the diffuse irradiance component during the first time interval; and
2) during a second time interval actuating the second group of the array of pixels of the filter matrix to pass the diffuse irradiance component and actuating the first group of the array of pixels to block the direct irradiance component during the second time interval.

2. The apparatus of claim 1, wherein the module comprises a photosensor.

3. The apparatus of claim 2, wherein the photo sensor comprises an imager photo sensor.

4. The apparatus of claim 3, wherein the imager photo sensor is selected from the group consisting of a charge coupled device (CCD) array, a metal-oxide-semiconductor (CMOS) array, a hybrid CCD/CMOS array, and any other semiconductor-based imaging sensor array.

5. The apparatus of claim 1, wherein the module comprises a calculator module configured to calculate a solar position indicative of the spatial location of the at least one of the irradiance components relative to the array of pixels of the filter matrix.

6. The apparatus of claim 1, wherein the array of pixels of the filter matrix is selected from the group consisting of an array of liquid crystal pixels, an array of electro-chromic pixels, and an array of micro-mirror pixels.

7. The apparatus of claim 1, wherein the module is configured to receive any selected one of the irradiance components passed by the filter matrix.

8. The apparatus of claim 7, further comprising a processor coupled to the module and configured to determine an irradiance measurement from the any selected one of the irradiance components received by the module.

9. The apparatus of claim 8, wherein the irradiance measurement determined by the processor comprises a measurement selected from the group consisting of a measurement of a direct irradiance component, a measurement of a diffuse irradiance component, and a measurement of global irradiance.

10. A sky imager comprising the apparatus of claim 3.

11. An apparatus comprising:
a filter matrix arranged to receive incident solar irradiance, the filter matrix comprising an array of pixels electrically controllable to provide a selectable field of view to select different irradiance components;
a photosensor, which is coupled to receive any selected one of the irradiance components from the filter matrix;
a processor electrically coupled to the photosensor and configured to determine an irradiance measurement from any irradiance component received by the photosensor;
a module configured to determine a spatial location of at least one of the any selected one of the irradiance components relative to the array of pixels of the filter matrix;
a controller responsive to the module and configured to:
supply a control signal to the filter matrix based on the determined spatial location of the irradiance component to pass the any selected one of the irradiance components, wherein the any selected one of the irradiance components comprises a direct irradiance component or a diffuse irradiance component;
sequentially perform the following:
1) during a first time interval actuating a first group of the array of pixels of the filter matrix to pass the direct irradiance component and actuating a second group of the array of pixels of the filter matrix to block the diffuse irradiance component during the first time interval; and
2) during a second time interval actuating the second group of the array of pixels of the filter matrix to pass the diffuse irradiance component and actuating the first group of the array of pixels to block the direct irradiance component during the second time interval.

12. The apparatus of claim 11, wherein the irradiance measurement determined by the processor comprises a measurement selected from the group consisting of a measurement of the direct irradiance component, a measurement of the diffuse irradiance component, and a measurement of global irradiance.

13. The apparatus of claim 11, wherein the module comprises a photosensor.

14. The apparatus of claim 11, wherein the photosensor comprises an imager photosensor.

15. The apparatus of claim 14, wherein the imager photosensor is selected from the group consisting of a charge coupled device (CCD) array, a metal-oxide-semiconductor (CMOS) array, a hybrid CCD/CMOS array, and any other semiconductor-based imaging sensor array.

16. The apparatus of claim 11, wherein the module comprises a calculator module configured to calculate a solar position indicative of the spatial location of the at least one of the any selected one of the irradiance components relative to the array of pixels of the filter matrix.

17. The apparatus of claim 11, wherein the array of pixels of the filter matrix is selected from the group consisting of an array of liquid crystal pixels, an array of electro-chromic pixels, and an array of micro-mirror pixels.

18. A sky imager comprising the apparatus of claim 14.

19. A method for selectively acquiring different components of solar irradiance with a single apparatus, the method comprising:
   arranging a filter matrix to receive incident solar irradiance, the filter matrix comprising an array of pixels electrically controllable to selectively acquire different irradiance components;
   determining a spatial location of at least one of the irradiance components relative to the array of pixels of the filter matrix;
   controlling the filter matrix based on the determined spatial location of the at least one of the irradiance component to pass a selected one of the irradiance components, wherein controlling the filter matrix comprises:
      actuating a first group of the array of pixels of the filter matrix to pass the selected one of the irradiance components and actuating a second group of the array of pixels of the filter matrix to block an unselected one of the irradiance components, wherein the selected one of the irradiance components is a direct irradiance component or a diffuse irradiance component, and wherein the unselected one of the irradiance components is the other of the direct irradiance component or the diffuse irradiance component;
   sequentially performing the following:
      1) during a first time interval actuating a first group of the array of pixels of the filter matrix to pass the direct irradiance component and actuating a second group of the array of pixels of the filter matrix to block the diffuse irradiance component during the first time interval; and
      2) during a second time interval actuating the second group of the array of pixels of the filter matrix to pass the diffuse irradiance component and actuating the first group of the array of pixels to block the direct irradiance component during the second time interval.

20. The method of claim 19, wherein the direct irradiance component is selectively attenuated by the first group of the array of pixels of the filter matrix.

21. The method of claim 19, further comprising measuring the direct irradiance component based on averaging the direct irradiance component passed by the first group of the array of pixels during a sequence of first time intervals and measuring the diffuse irradiance based on averaging the diffuse irradiance component passed by the second group of the array of pixels during a sequence of second time intervals.

22. A method for selectively acquiring different components of solar irradiance with a single apparatus, the method comprising:
   arranging a filter matrix to receive incident solar irradiance, the filter matrix comprising an array of pixels electrically controllable to selectively acquire different irradiance components;
   determining a spatial location of at least one of the irradiance components relative to the array of pixels of the filter matrix;
   controlling the filter matrix based on the determined spatial location of the at least one irradiance component to pass a selected one of the irradiance components, wherein the controlling the filter matrix comprises:
      actuating a first group of the array of pixels of the filter matrix to pass the selected one of the irradiance components, and actuating a second group of the array of pixels of the filter matrix to block an unselected one of the irradiance components, wherein the selected one of the irradiance components is a direct irradiance component or a diffuse irradiance component, and wherein the unselected one of the irradiance components is the other of the direct irradiance component or the diffuse irradiance component;
   sequentially performing the following:
      1) during a first time interval actuating a first group of the array of pixels of the filter matrix to pass the direct irradiance component and actuating a second group of the array of pixels of the filter matrix to block the diffuse irradiance component during the first time interval;
      2) during a second time interval actuating the second group of the array of pixels of the filter matrix to pass the diffuse irradiance component and actuating the first group of the array of pixels to block the direct irradiance component during the second time interval; and
   measuring the direct irradiance component based on averaging the direct irradiance passed by the first group of the array of pixels during a sequence of first time intervals and measuring the diffuse irradiance component based on averaging the diffuse irradiance component passed by the second group of the array of pixels during a sequence of second time intervals.

* * * * *